United States Patent
Gotoh et al.

(10) Patent No.: US 11,791,160 B2
(45) Date of Patent: Oct. 17, 2023

(54) POLYCRYSTALLINE FILM, METHOD FOR FORMING POLYCRYSTALLINE FILM, LASER CRYSTALLIZATION DEVICE AND SEMICONDUCTOR DEVICE

(71) Applicants: V TECHNOLOGY CO., LTD., Yokohama (JP); KYUSHU UNIVERSITY, NATIONAL UNIVERSITY CORPORATION, Fukuoka (JP)

(72) Inventors: Jun Gotoh, Yokohama (JP); Kaori Saito, Yokohama (JP); Hiroshi Ikenoue, Fukuoka (JP)

(73) Assignees: KYUSHU UNIVERSITY, NATIONAL UNIVERSITY CORPORATION, Fukuoka (JP); V TECHNOLOGY CO., LTD., Yokohama (JP)

( * ) Notice: Subject to any disclaimer, the term of this patent is extended or adjusted under 35 U.S.C. 154(b) by 0 days.

(21) Appl. No.: 17/791,047

(22) PCT Filed: Dec. 15, 2020

(86) PCT No.: PCT/JP2020/046746
§ 371 (c)(1),
(2) Date: Jul. 6, 2022

(87) PCT Pub. No.: WO2021/140849
PCT Pub. Date: Jul. 15, 2021

(65) Prior Publication Data
US 2023/0027404 A1 Jan. 26, 2023

(30) Foreign Application Priority Data
Jan. 10, 2020 (JP) .................. 2020-002754

(51) Int. Cl.
*H01L 21/02* (2006.01)
*C22F 3/02* (2006.01)
(Continued)

(52) U.S. Cl.
CPC ............ *H01L 21/0268* (2013.01); *C22F 3/02* (2013.01); *H01L 21/67115* (2013.01);
(Continued)

(58) Field of Classification Search
CPC ........... H01L 21/0268; H01L 21/67115; H01L 23/53214; H01L 23/53228; H01L 29/04;
(Continued)

(56) References Cited

U.S. PATENT DOCUMENTS

2007/0238270 A1* 10/2007 Kim .................. H01L 21/02691
257/E21.134
2012/0220140 A1 8/2012 Kajiyama et al.

FOREIGN PATENT DOCUMENTS

JP 63-060517 A 3/1988
JP 63060517 A * 3/1988
(Continued)

OTHER PUBLICATIONS

International Search Report for corresponding International Patent Application No. PCT/JP2020/046746 dated Mar. 2, 2021, with English Translation (5 pp.).
(Continued)

*Primary Examiner* — John P. Dulka
(74) *Attorney, Agent, or Firm* — WEIHROUCH IP

(57) ABSTRACT

The present invention provides a microstructure in which evenly distributed crystal grains line up in parallel lines extending along the surface of the film, and a no-lateral-growth region left at each of locations exposed to both ends of a grain interface, which serves as a partition between the neighboring two crystal grains. According to the present
(Continued)

invention, there are also provided: a method for forming a polycrystalline film, such as a thin polycrystalline silicon film, a thin aluminum film, and a thin copper film, which is flat and even, in surface, electrically uniform and stable, and mechanically stable; a laser crystallization device for use in manufacture of polycrystalline films, and a semiconductor device using the polycrystalline film and having good electrical property and increased breakdown voltage.

19 Claims, 19 Drawing Sheets

(51) Int. Cl.
  *H01L 21/67* (2006.01)
  *H01L 23/532* (2006.01)
  *H01L 29/04* (2006.01)
  *H01L 29/786* (2006.01)

(52) U.S. Cl.
  CPC .. *H01L 23/53214* (2013.01); *H01L 23/53228* (2013.01); *H01L 29/04* (2013.01); *H01L 29/78675* (2013.01); *H01L 29/78678* (2013.01)

(58) Field of Classification Search
  CPC ......... H01L 29/78675; H01L 29/78678; H01L 21/02422; H01L 21/02532; H01L 21/02595; H01L 21/268; H01L 21/3205; H01L 21/768; H01L 23/532; H01L 29/66477; H01L 29/786; H01L 29/78672; H01L 21/02678; H01L 21/321; H01L 29/66742; C22F 3/02; B23K 26/00
  See application file for complete search history.

(56) References Cited

FOREIGN PATENT DOCUMENTS

| | | |
|---|---|---|
| JP | 05-190449 A | 7/1993 |
| JP | 2007-281465 A | 10/2007 |
| JP | 2012-019231 A | 1/2012 |
| JP | 5534402 B2 | 7/2014 |

OTHER PUBLICATIONS

Written Opinion for corresponding International Patent Application No. PCT/JP2020/046746 dated Mar. 2, 2021, (4 pp.).

* cited by examiner

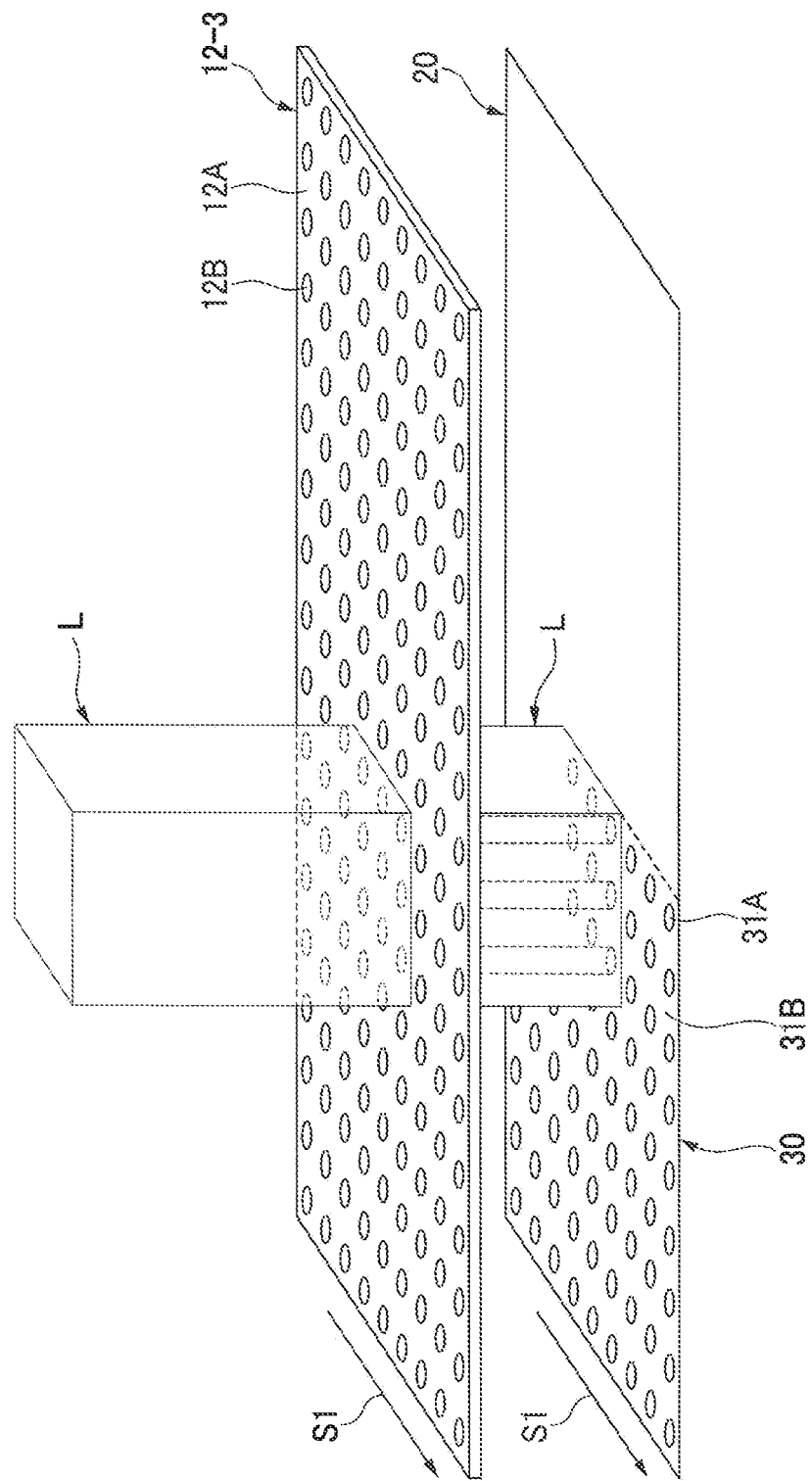

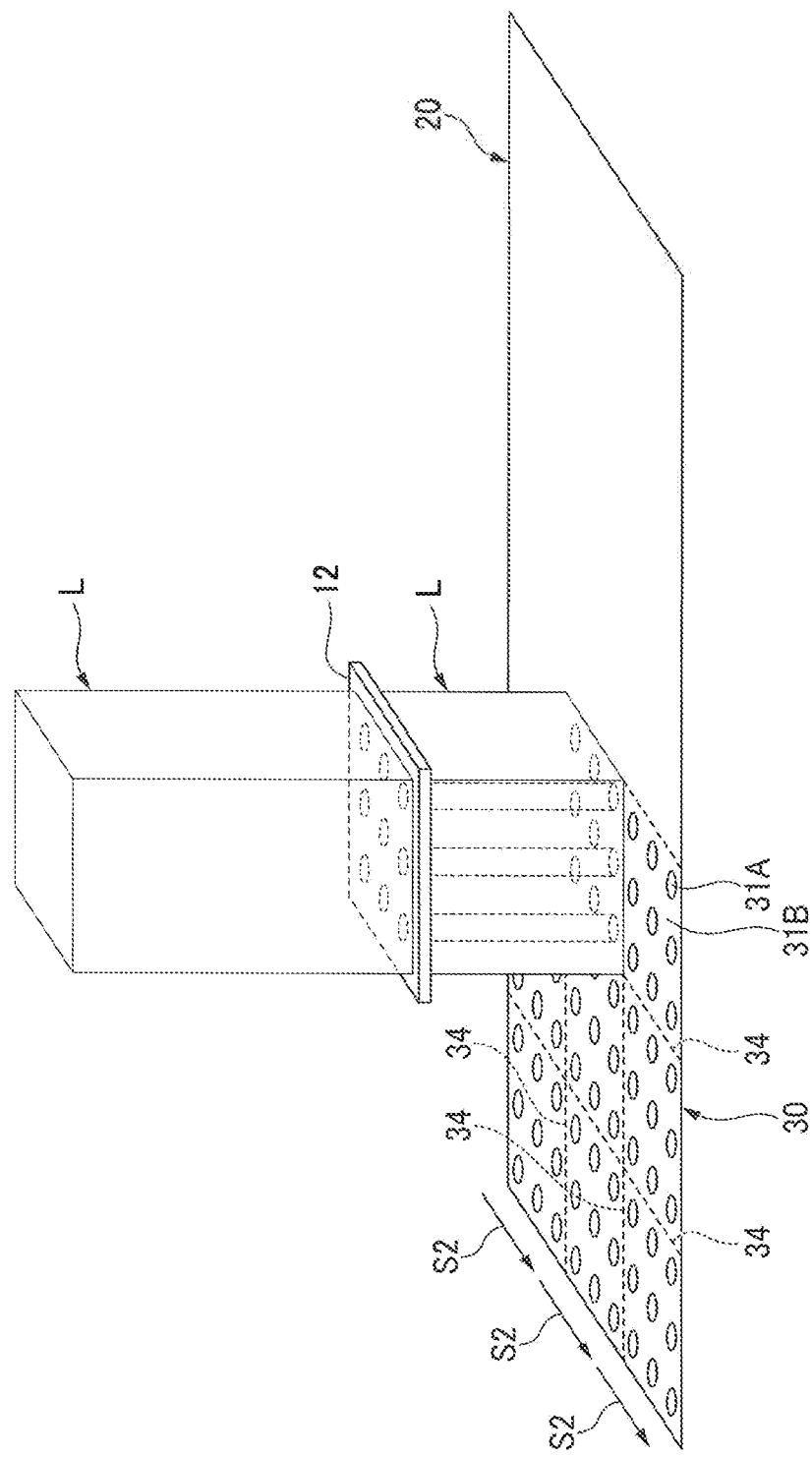

POLYCRYSTALLINE FILM, METHOD FOR FORMING POLYCRYSTALLINE FILM, LASER CRYSTALLIZATION DEVICE AND SEMICONDUCTOR DEVICE

CROSS-REFERENCE TO RELATED APPLICATION

This application is a 371 National Phase Application of International Patent Application PCT/JP2020/046746, filed Dec. 15, 2020, which claims priority to Japanese Patent Application No. 2020-002754, filed Jan. 10, 2020, the entire contents of which are incorporated herein by reference and priority is claimed to each.

FIELD OF THE INVENTION

The present invention relates to a polycrystalline film, a method for forming polycrystalline film, a laser crystallization device, and a semiconductor device.

BACKGROUND

Thin semiconductor films or thin metal films are processed for semiconductor devices. Examples of thin semiconductor films are thin silicon films and thin amorphous silicon films and thin polycrystalline films. Examples of thin metal films are thin aluminum films and thin copper films.

Flat panel displays (FPD: Flat Panel Display), such as liquid crystal panels or organic EL (Electro-Luminescence) panels, use a vast number of thin film transistors (hereinafter referred to as TFTs) as switching elements. TFTs use thin silicon films, such as thin amorphous silicon films and thin polycrystalline silicon films, for their active layers. Thin amorphous silicon films are processed for thin polycrystalline silicon films using various laser processes including laser annealing to initiate phase transitions from laser induced melting to solidification to obtain microstructures.

Methods and processes are known for forming thin polycrystalline silicon films. Patent literature 1 (i.e., JP 5534402 B2) and patent literature 2 (i.e., JP 2007-281465 A) describe such methods and processes. Patent literature 1 describes a method that uses a first laser annealing and a second or subsequent laser annealing. With a mask having a pattern in which an opaque region is surrounded on its outer boundary by a transparent region, a thin amorphous silicon film is irradiated with a laser beam in the first laser annealing step. In the second or subsequent laser annealing step, without the mask, the amorphous silicon film is irradiated with a laser beamlet having sufficient energy to effect complete melt of only the amorphous silicon without effecting melt of the polycrystalline silicon. According to this known method, lateral crystal growth is initiated when irradiated regions are fully melted and solidification is initiated at the solidus-liquidus interface between masked and unmasked regions, so that a crystal grows in radial outward directions using the associated one masked region as a seeding site. This results in creation of a thin polycrystalline silicon film composed of uniform crystal grains.

Patent literature 2 describes a method of forming a thin polycrystalline silicon film using a mask having a pattern in which an opaque region is less, in area, than the resolution limit and a transparent region is greater, in area, than the resolution limit.

As mentioned before, examples of thin metal films for semiconductor devices are thin copper films and thin aluminum films. The electrical resistivity or specific resistivity of copper (Cu) is low, so the threshold current density increases. The electrical resistivity of aluminum (Al) is low next to that of silver (Ag) and that of copper (Cu).

PRIOR ART

Patent Literature

Patent literature 1: JP 5534402 B2
Patent literature 2: JP 2007-281465 A

SUMMARY OF THE INVENTION

Problems to be Solved

In accordance with the methods described in patent literatures 1 and 2, neighboring grains grown from seed crystals form a grain interface where they meet. As they grow, the stress concentration at the confluence of three or four grain boundaries at a triple or quadruple point forms pronounced mounts. Such surface protrusions of a polycrystalline silicon film cause a problem that breakdown voltage for TFT decreases.

With increasingly shrinking interconnect stripe widths, metallization may have the following problems. For example, if thin aluminum film formed by sputtering is used as material for wiring, interconnect resistance rises and electromigration shortens device lifetime because of migration of aluminum atoms. High-temperature treatment is proved to be effective in extending lifetime for aluminum (Al) wiring because aluminum grains line up in a bamboo structure. However, high-temperature heat treatment is not applicable to fabrication of flat panel displays (FPDs), such as liquid crystal display devices because the glass substrate has melting point ranging from 400 to 500° C. There are more challenges to overcome when applying high-temperature heat treatment to Al wire connection on resin substrate because the resin substrate is lower, in melting point, than the glass substrate.

Further, conventional film deposition, such as chemical vapor deposition (CVD) and sputtering deposition, does not suffice to apply copper (Cu) to a sufficient thickness for wire connection. Moreover, the thin copper film is extremely difficult to be processed by etching. To address the problems, damascene patterning process, in which electroplating is used to grow copper (Cu) in grooves formed beforehand, is being widely used.

As is known, columnar structures and sparse grain boundaries, which are not observed in bulk material, are generated during electroplating for growing thin copper film. Such thin copper film has factors, such as, raised resistance and intergranular disconnection, which lower the reliability of wire connection. Improving the crystal quality by subjecting the thin copper film to heat treatment is a measure to prevent rapid disconnection of wire connection. However, residual high tensile stress remains in wiring covered by or stayed connected with other material immediately after heat treatment, causing stress dependent migration to occur, decreasing reliability of wiring.

In view of the above-mentioned issues, an object of the present invention is to provide polycrystalline films, such as thin polycrystalline silicon films, thin aluminum films, and thin copper films, which are free from surface protrusions, electrically homogeneous and stable, and mechanically stable, a method for creating the polycrystalline films, a laser crystallization device for use in manufacture of the polycrystalline films, and semiconductor devices including the polycrystalline films and having good electrical property and increased breakdown voltage.

Means for Solving Problems

In view of above, there is provided a polycrystalline film, including: evenly distributed crystal grains lining up in parallel lines extending along the surface of the film, and a no-lateral-growth region left at each of locations exposed to both ends of a grain interface, which serves as a partition between the neighboring two crystal grains, in a pattern that exposes the laterally crystallized film after lateral crystal growth, where: one of the both ends of the grain interface is separated from the other in a direction along the surface of the film.

It is preferable that the film surface portions of the crystal grains are flush with the film surface portions of the no-lateral-growth regions to make a flat and even surface.

It is preferable that each of the crystal grains is in the shape of a column having a height from the lower surface to the upper surface of the film, and the crystal grain includes a crystal core in the middle inside its limits within the surface of the film, the crystal core being in the shape of a column having a height from the lower surface to the upper surface of the film.

It is preferable that the distance, within the surface of the film, from the crystal core of each of the neighboring two crystal grains to the no-lateral-growth region is not shorter than the maximal lateral crystal growth length of the crystal grains.

It is preferable that the crystal grains and the no-lateral-growth regions are made of a material selected from semiconductor materials and metals.

In another aspect of the present invention, there is provided a method for forming a polycrystalline film by directing laser through a mask to irradiate an amorphous film to leave a large number of evenly distributed crystal grains lining up in parallel lines extending along the surface of the film, the method including: providing a mask configured to modulate that portion of the laser which is directed therethrough to evenly distributed seed crystal generating regions set beforehand on an amorphous film to have an attenuated intensity; allowing the amorphous film to crystalize using the seed crystal generating regions as seed crystals, and leaving a no-lateral-growth region left at each of locations exposed to both ends of a grain interface, which serves as a partition between the neighboring two crystal grains, in a pattern that exposes the laterally crystallized film after lateral crystal growth, where: one of the both ends of the grain interface is separated from the other in a direction along the surface of the film.

It is preferable that the distance between the seed crystal generating region for one of the neighboring two crystal grains with the grain interface therebetween and that for the other is shorter than two times the maximal crystal growth length of the crystal grains, and the distance between the seed crystal generating regions for the neighboring two crystal grains with the no-lateral-growth region therebetween is longer than two times the maximal crystal growth length of the crystal grains.

It is preferable that the amorphous film is made of a material selected from semiconductor materials and metals.

In other aspect of the present invention, there is provided a laser crystallization device, including: a laser source for generating laser; and a mask configured to modulate the laser directed therethrough to the surface of an amorphous film, wherein the mask is configured to modulate that portion of the laser which is directed therethrough to evenly distributed seed crystal generating regions set beforehand on an amorphous film to have an attenuated intensity; the laser with which a portion of the amorphous film adjacent to at least one of the seed crystal generation regions is irradiated has an intensity that is sufficient to melt through the entire thickness of the irradiated portion; the irradiated portion of the amorphous film laterally crystalizes using the seed crystal generating regions as seed crystals upon cooling, and the mask is configured to leave a no-lateral-growth region left at each of locations exposed to both ends of a grain interface, which serves as a partition between the neighboring two crystal grains, in a pattern that exposes the laterally crystallized film after lateral crystal growth, where: one of the both ends of the grain interface is separated from the other in a direction along the surface of the film.

It is preferable that the mask includes an opaque array pattern which allows that the distance between the seed crystal generating region for one of the neighboring two crystal grains with the grain interface therebetween and that for the other is shorter than two times the maximal crystal growth length of the crystal grains, and that the distance between the seed crystal generating regions for the neighboring two crystal grains with the no-lateral-growth region therebetween is longer than two times the maximal crystal growth length of the crystal grain.

It is preferable that the amorphous film is made of a material selected from semiconductor materials and metals.

In other aspect of the present invention, there is provided a semiconductor device including: a polycrystalline film including evenly distributed crystal grains lining up in parallel lines extending along the surface of the film, and a no-lateral crystal growth region left at each of locations exposed to both ends of a grain interface, which serves as a partition between the neighboring two crystal grains, in a pattern that exposes the laterally crystallized film after lateral crystal growth, one of the both ends of the grain interface being separated from the other in a direction along the surface of the film.

It is preferable that the film surface portions of the crystal grains are flush with the film surface portions of the no-lateral-growth regions to make a flat and even surface.

It is preferable that each of the crystal grains is in the shape of a column having a height from the lower surface to the upper surface of the film, and the crystal grain includes a crystal core in the middle inside its limits within the surface of the film, the crystal core being in the shape of a column having a height from the lower surface to the upper surface of the film.

It is preferable that the distance, within the surface of the film, from the seed crystal forming region for each of the neighboring two crystal grains to one of the no-lateral-growth regions is not shorter than the maximal lateral crystal growth length of the crystal grains.

It is preferable that the crystal grains and the no-lateral-growth regions are made of a material selected from semiconductor materials and metals.

It is preferable that the polycrystalline film is a polycrystalline silicon film, and the polycrystalline silicon film is an active semiconductor layer forming a channel region of a thin film transistor.

It is preferable that the thin film transistor is a bottom gate thin film transistor.

It is preferable that the thin film transistor is a top gate thin film transistor.

It is preferable that the polycrystalline film is made of aluminum (Al) and the crystal grains line up in a bamboo structure after patterning.

It is preferable that the polycrystalline film is made of copper (Cu).

Technical Effectiveness

Embodiments according to the present invention provide: polycrystalline films, such as thin polycrystalline silicon films, thin aluminum films, and thin copper films, which are free from surface protrusions, electrically homogeneous and stable, and mechanically stable; a method for forming the polycrystalline films; a laser crystallization device for use in manufacture of the polycrystalline films, and semiconductor devices using the polycrystalline films and having good electrical property and increased breakdown voltage.

BRIEF DESCRIPTION OF THE DRAWINGS

FIG. 11-1 is a cross-section of the microstructure of a thin aluminum film that results from a method for forming a polycrystalline film according to a second embodiment of the present invention.

FIG. 11-2 schematically illustrates processes of laser irradiation and of lateral crystal growth which result from the method for forming a polycrystalline film according to the second embodiment of the present invention.

FIG. 11-3 is a schematic cross-sectional diagram of an aluminum film that results from the method for forming a polycrystalline film according to the second embodiment of the present invention.

FIG. 16 is a schematic diagram of a laser crystallization device according to other embodiment of the present invention.

FIG. 17 is a schematic diagram of a comparative example used for assessment of the laser crystallization device according to the above-mentioned embodiment of the present invention.

DETAILED DESCRIPTION

Referring to the accompanying drawings, the following description provides specific details in order to provide a thorough description of embodiments of the present invention, which pertain to a polycrystalline film, a method for forming the polycrystalline film, a laser crystallization device, and a semiconductor device. Note, any drawings accompanying the application are for illustrative purposes only, and are thus not drawn to scale.

Figure 1:
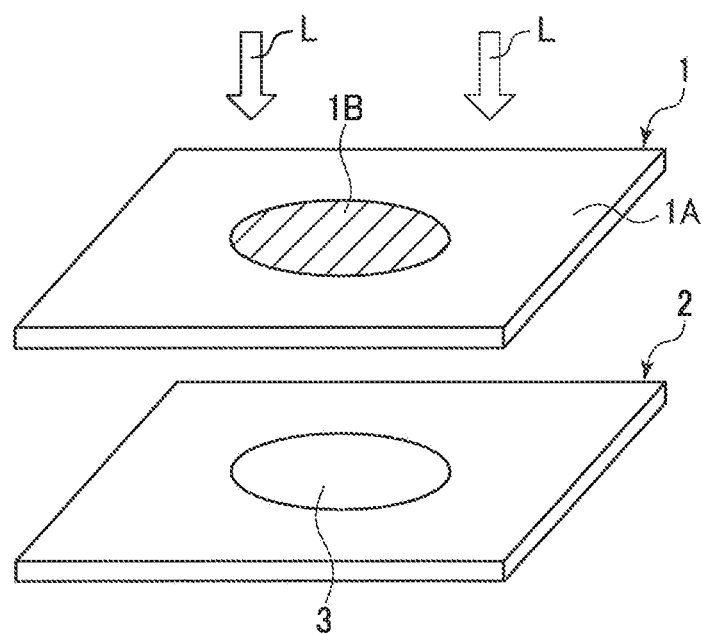
FIG. 1 is a schematic diagram of a portion of a laser crystallization device.

Referring, now, to FIGS. 1 to 4, the outline of the configuration and operation of a conventional laser crystallization device is given prior to the specific description of the embodiments pertaining to a polycrystalline film, a method for forming the polycrystalline film, a laser crystallization device, and a semiconductor device. As shown in FIG. 1, the laser crystallization device irradiates an amorphous film 2 with a laser beam L through a photomask 1 used in photolithography. The mask 1 is a transparent glass substrate 1A formed with an opaque region 1B. Using the mask 1, the amorphous film 2 has an unirradiated or masked region 3 protected by the opaque region 1B against irradiation. The remaining irradiated or unmasked region on the amorphous film 2 is irradiated with a laser beam L and melts.

Figure 2:
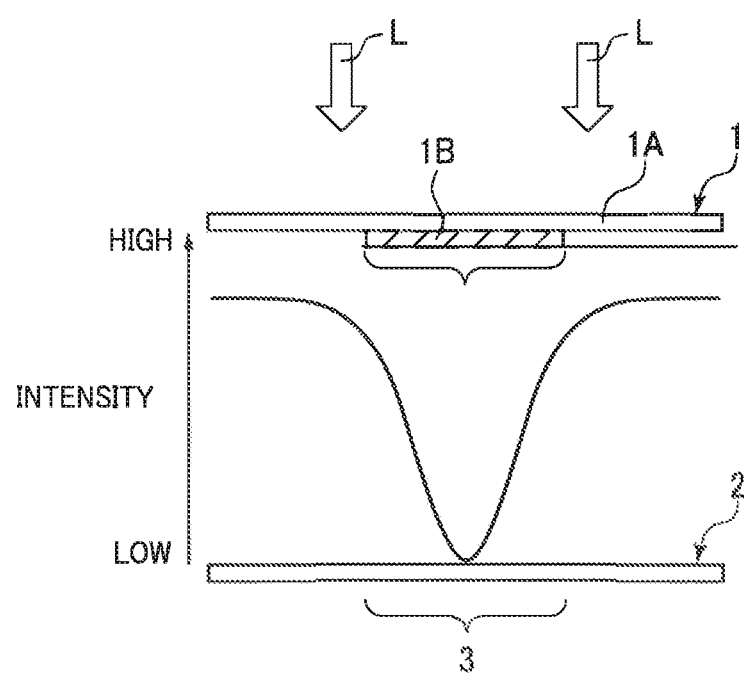
FIG. 2 is a schematic diagram of the light intensity distribution in the laser crystallization device.
Figure 3:
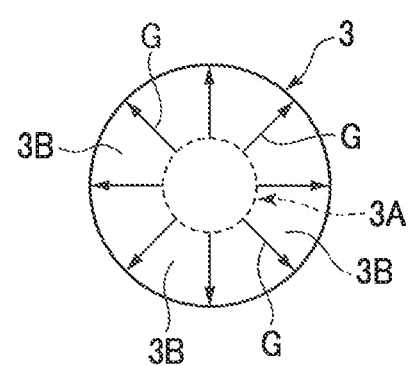
FIG. 3 is a schematic diagram of the lateral crystal growth in radial directions from the associated crystal core or crystal nuclei upon cooling after laser irradiation.
Figure 4:
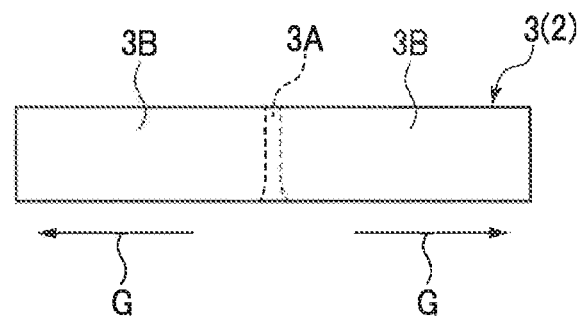
FIG. 4 is a schematic cross-sectional diagram of the region in which lateral crystal growth is initiated after laser irradiation.

FIG. 2 schematically depicts the light intensity distribution from the center of the unirradiated region 3 on the amorphous film 2 in one and the opposite radial directions while the amorphous film 2 is being irradiated with a laser beam L through the mask 1. This light intensity distribution is analogous to the temperature distribution from the center of the masked region 3 on the amorphous film 2 in the one and the opposite radial directions. As FIGS. 3 and 4 depict, the masked region 3 has peripheral portions 3B in the proximity of the interface between the masked and unmasked regions which melts in the heat conduction from the irradiated or unmasked region. Since the center and its proximity portion of the masked region 3 is less heated in the heat conduction from the irradiated or unmasked region, it does not melt and remains as a microcrystalline region 3A, which serves as a seed crystal forming region or crystal core (crystal nuclei). This microcrystalline region 3A grows, as a crystal nuclei (seed crystal), in radial directions G. Such crystal growth extends from the unirradiated region 3 into the irradiated region.

[First Embodiment] (Laser Crystallization Device and Method for Forming a Polycrystalline Film)

FIGS. 5 to 10 depict a laser crystallization device 10 according to the first embodiment of the present invention and a method for forming a polycrystalline film using the laser crystallization device 10. In the present embodiment, an amorphous film in the form of a thin amorphous silicon film 20, which is provided as a precursor, results in a polycrystalline film in the form of a polycrystalline silicon film 30.

Figure 5:
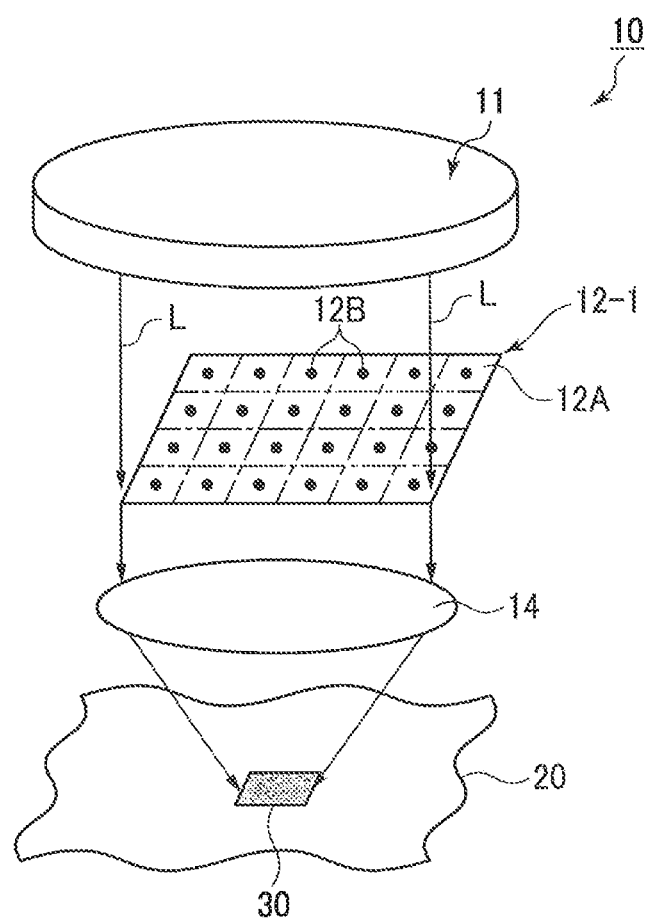
FIG. 5 is a schematic diagram of the laser crystallization device according to a first embodiment of the present invention.
Figure 6:
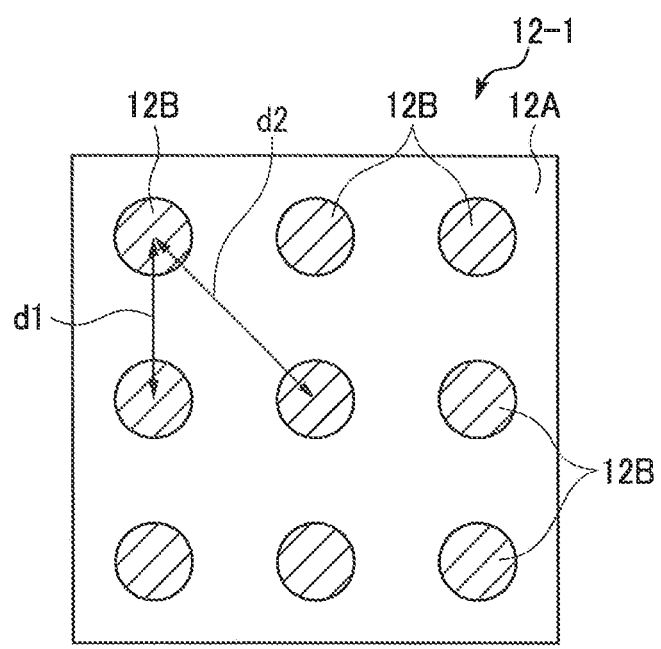
FIG. 6 is a schematic plan view of a portion of a mask used in the laser crystallization device according to the first embodiment of the present invention.

As depicted in FIG. 5, the laser crystallization device 10 includes laser source 11, a mask or masking system 12-1, and lens system 14. As depicted in FIG. 6, the mask 12-1 has an array pattern of opaque regions 12B, so-called an opaque array pattern, arranged to form columns and rows of a matrix over the glass substrate 12A. That is, the opaque regions 12B are evenly distributed on the surface of the glass substrate 12A to columns and rows of a matrix. The mask 12-1 has transparent regions uncovered by the opaque regions 12B to allow the passage of laser beam L therethrough.

The mask 12-1 modulates the laser beam L oscillated from the laser source 11. The modulated laser beam L passes through the lens system 14 and strikes the surface of the thin amorphous silicon film 20. The mask 12-1 reduces the optical energy striking the surface of the thin amorphous silicon film 20 at evenly distributed unirradiated regions (see FIGS. 1 and 2), each including a microcrystalline region 31A (see FIG. 9).

Figure 7:
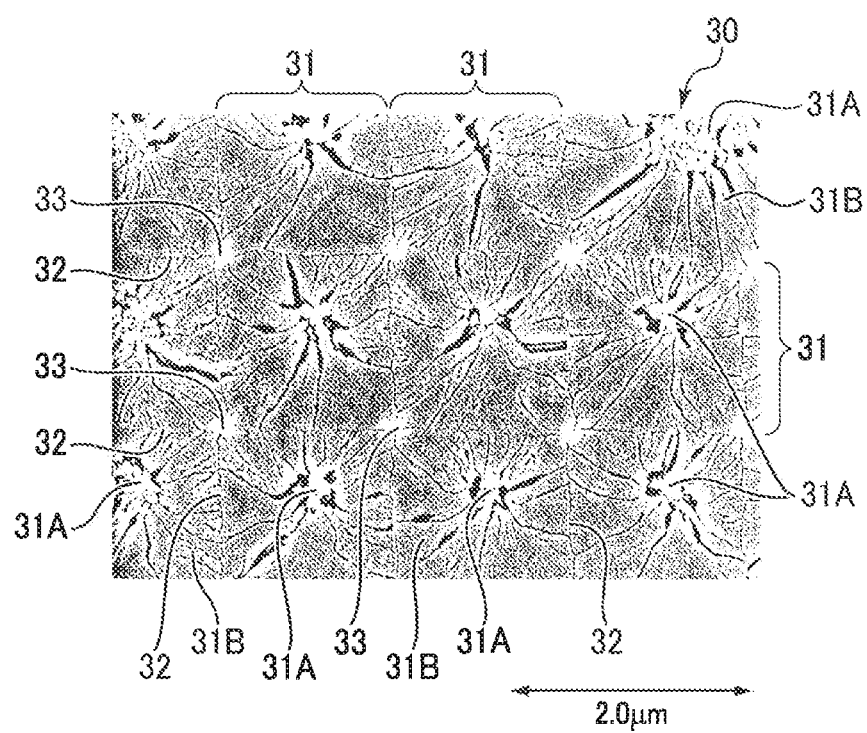
FIG. 7 is an image of the microstructure of a polycrystalline film that results from a method for forming a polycrystalline film using the laser crystallization device according to the first embodiment of the present invention.
Figure 8:
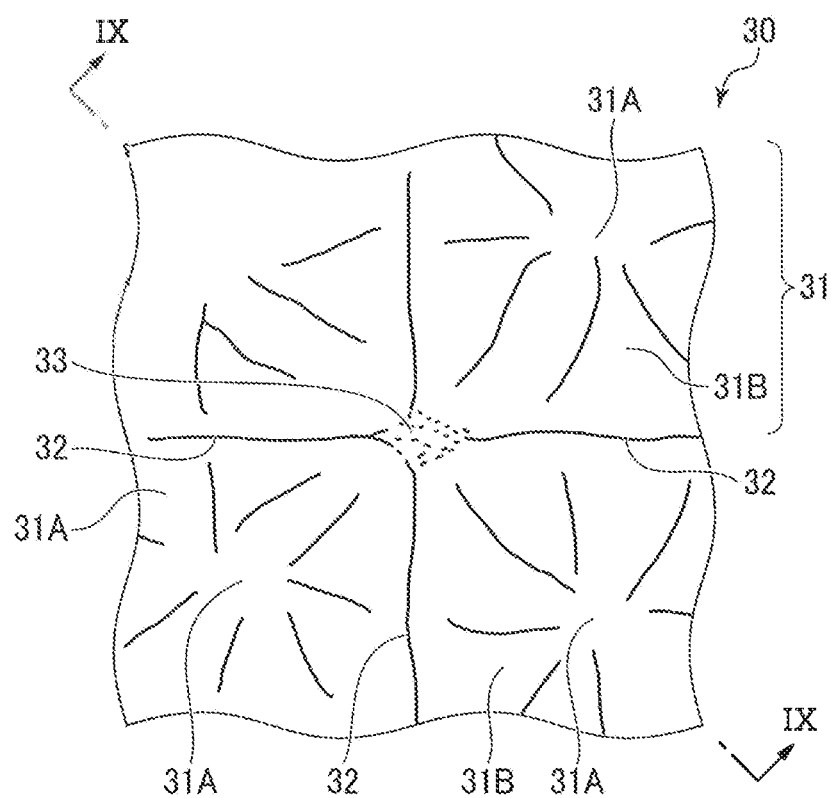
FIG. 8 is a schematic diagram of a portion of the microstructure of a polycrystalline film that results from the method for forming a polycrystalline film using the laser crystallization device according to the first embodiment of the present invention.

In this laser crystallization device 10, using irradiation with laser beam L passed through the mask 12-1, the thin amorphous silicon film 20 within each of irradiated regions, which are adjacent to unirradiated regions each including a microcrystalline region 31A, is fully melted. As a result, the peripheral portion of each of the unirradiated regions is heated by heat conduction and melted, leaving the center of the unirradiated region as the microcrystalline region 31A. Lateral crystal growth is initiated upon cooling after irradiated regions are fully melted, commencing solidification using microcrystalline regions 31A as seed crystal forming regions to grow crystal grains 31 as shown in FIGS. 7 and 8. In each crystal grain 31, the region around the microcrystalline region 31A is a lateral crystal growth portion 31B.

Figure 14:
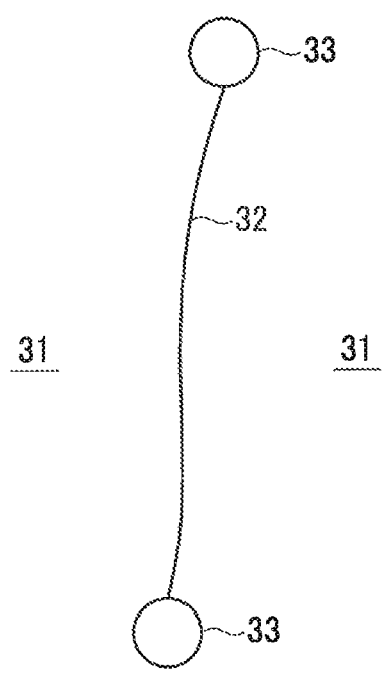
FIG. 14 is a schematic diagram of the arrangement of no-lateral-growth regions and a grain interface.

As schematically depicted in FIG. 14, this laser crystallization device 10 is set to leave a no-lateral-growth region 33 at each of locations exposed to both ends of a grain interface 32, which serves as a partition between the neighboring two crystal grains 31, 31, in a pattern that exposes the laterally crystallized film after lateral crystal growth. One of the both ends of the grain interface 32 is separated from the other in a direction along the surface of the film 30.

In detail, the distance between each and the neighboring one of central microcrystalline regions 31A, which serve as seeding sites for lateral crystal growth, in each of rows and columns on selected area of the surface of the thin amorphous silicon film 20 is shorter than twice the maximal lateral crystal growth length (i.e., 1.5 μm) of the crystal grains 31. Thus, as depicted in FIG. 6, the setting of the mask 12-1 is such that the distance d1 between each and the neighboring one of dots 12B in each of rows and columns is determined to provide the above-mentioned arrangement of the seeding sites on the surface of the thin amorphous silicon film 20.

Further, the distance between any two neighboring of the microcrystalline regions 31A which are diagonally opposite to each other on the selected area of the thin amorphous silicon film 20 is longer than twice the maximal lateral crystal growth length of the crystal grains 31. As depicted in FIG. 6, the setting of the mask 12-1 is such that the distance d2 between any two neighboring dots 12B which are diagonally opposite to each other is determined to provide the above-mentioned arrangement of the seeding sites on the surface of the thin amorphous silicon film 20.

Figure 10:
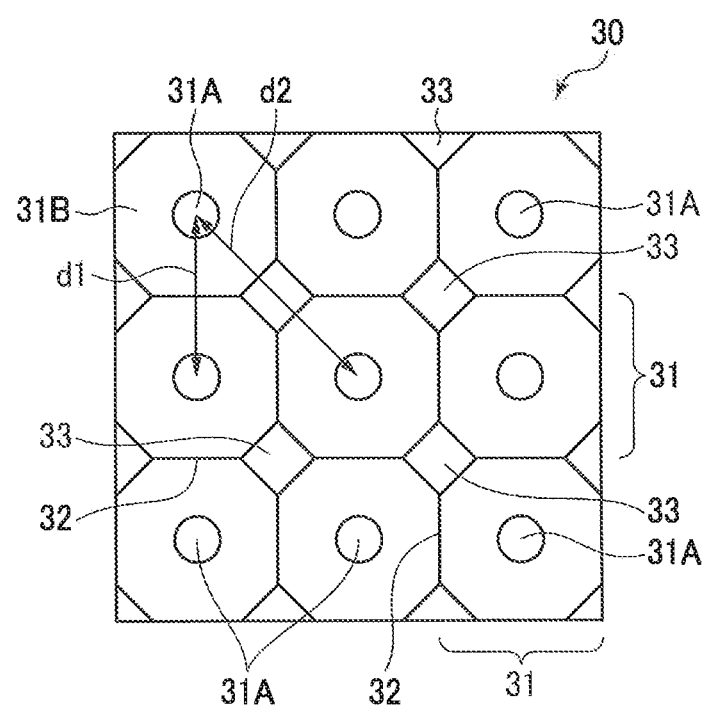
FIG. 10 is a schematic diagram showing the microstructure of a polycrystalline film that results from a method for forming a polycrystalline film using the laser crystallization device according to the first embodiment of the present invention.

In such a laser crystallization device 10 and a method for forming a polycrystalline film using the same, laser annealing using the mask 12-1 configured as described above initiates lateral crystal growth using the microcrystalline regions 31A as seeding sites in a polycrystalline silicon film 30 as shown in FIGS. 7, 8 and 10. One of no-lateral-growth regions 33 is left at each of locations exposed to both ends of a grain interface 32, which serves as a partition between the neighboring two crystal grains 31, in a pattern that exposes the laterally crystallized film after lateral crystal growth. Note that one of the both ends of the grain interface 32 is separated from the other in a direction along the surface of the film 30.

Further, in the polycrystalline silicon film 30 according to the present embodiment, the surface portions of crystal grains 31 are flush with the surface portions of no-lateral-growth regions 33. This is because the lateral crystal growth does not extend beyond the maximal lateral crystal growth length into the no-lateral-growth regions 33 which are left after lateral crystal growth, so the stress concentration otherwise created among the neighboring crystal grains 31 is avoided. Thus, the no-lateral-growth regions 33 serve as sites for mitigating the stress concentration derived from lateral crystal growth.

Figure 9:
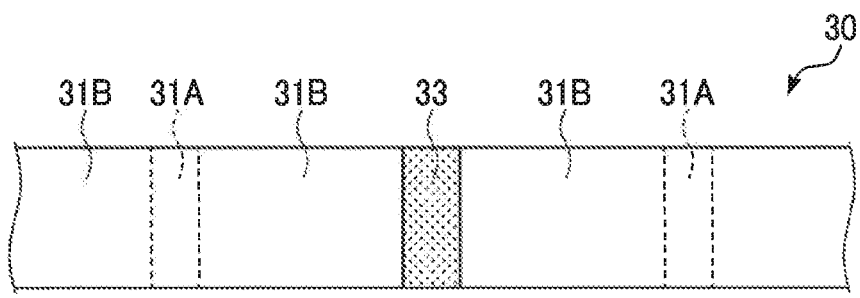
FIG. 9 is a schematic cross-section of FIG. 8 taken through the line IX-IX.

The laser crystallization device and the method for forming a polycrystalline film according to the present embodiment generates a polycrystalline silicon film 30, as depicted in FIGS. 9 and 10, in which each grown crystal grain 31 is in the form of a column with a height, i.e., a distance from the lower side to the upper side of the silicon film 30. The microcrystalline region 31A remains at the center of each crystal grain 31 as a crystal core, i.e., a seeding site for lateral crystal growth, in the form of a column having a height from the lower side to the upper side of the crystalline silicon film 30. In each crystal grain 31, the area occupied by the microcrystalline region 31A in the upper or lower side is small, as compared to the area occupied by the crystal growth portion 31B surrounding the microcrystalline region 31A. Thus, the laser crystallization device and the method for forming a polycrystalline film according to the present embodiment reduce electrical resistance through the polycrystalline silicon film 30. Moreover, the laser crystallization device and the method for forming a polycrystalline film according to the present embodiment reduce variation in size and shape of crystal grains 31 laterally grown with the microcrystalline regions as seeding sites because the arrangement of the microcrystalline regions 31A corresponds to the designed spacing between the dots of the mask 12-1. Therefore, the polycrystalline silicon film 30 provided by the laser crystallization device and the method for forming a polycrystalline film according to the present embodiment has uniform electrical and mechanical properties and it performs as a high-quality semiconductor active region.

[Second Embodiment]

Figures 1, 11:
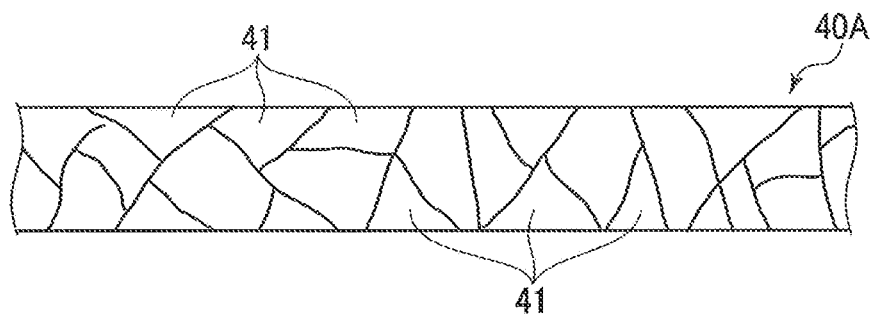
Figures 2, 11:
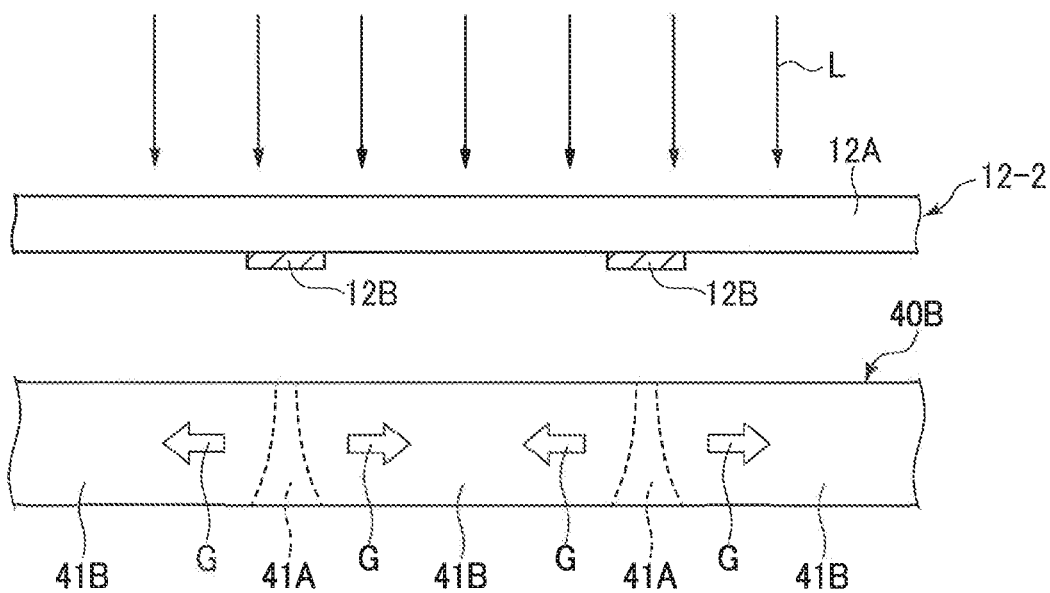
Figures 3, 11:
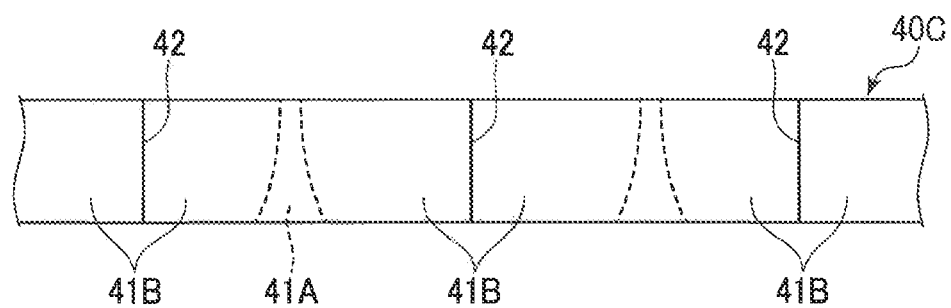

FIGS. 11-1 to 11-3 depict a method for forming a polycrystalline film according to the second embodiment, and a polycrystalline film, in the form of a polycrystalline aluminum film 40, which results from the method according to the second embodiment.

First, in the second embodiment, the thin aluminum film 40A is formed on a glass substrate (not shown). In order to deposit the aluminum film 40A on a glass substrate, aluminum atoms are ejected toward the substrate by sputtering. As depicted in FIG. 11-1, microcrystals 41 dominate the aluminum film 40A structure after sputtering. Therefore, electric resistance of the aluminum film 40A dominated by the microcrystals 41 is high. If the aluminum film 40A dominated by the microcrystals 41 is patterned to form wiring, electromigration causes a problem of shortening the life span of the interconnection because it is not negligible.

Referring, next, to FIG. 11-2, a laser beam L from a laser source, not shown, is modulated using a mask 12-2 having the same arrangement of the dots, i.e., opaque regions 12B, of the mask pattern as that of the mask 12-1 used in the before-described laser crystallization device 10 according to the first embodiment, and, with the modulated laser beam, the surface of the aluminum film 40A is irradiated. This initiates melting of a region of the aluminum film 40A leaving those locations which correspond to the dots, i.e., opaque regions 12B, of the mask 12-2 partially melted to make microcrystalline regions 41A. After the region is melted, the melted area of the aluminum film is laterally crystallized from the microcrystalline regions 41A upon cooling to create crystal grown regions 41B.

Referring to FIG. 11-3, each crystal core is partitioned off with the grain interfaces 42. Further, similarly to the before-described polycrystalline silicon film 30 according to the first embodiment, a no-lateral-growth region is left at each of locations exposed to both ends of a grain interface 42, which serves as a partition between the neighboring two crystal grains, in a pattern that exposes the laterally crystallized film after lateral crystal growth to generate the aluminum film 40C, where: one of the both ends of the grain interface is separated from the other in a direction along the surface of the film. Thus, the no-lateral-growth regions, in the aluminum film 40C, serve as sites for mitigating the stress concentration derived from crystal growth to avoid surface protrusions of the aluminum film 40C. After patterning to form wiring, the aluminum (Al) crystal grains line up in a bamboo structure, providing improved electrical characteristics.

Further, in the present embodiment, appropriately setting the irradiation condition of the laser beam suppresses the occurrence of thermal damage to the glass substrate on which the aluminum film 40C is deposited.

(Semiconductor Device)

Figure 12:
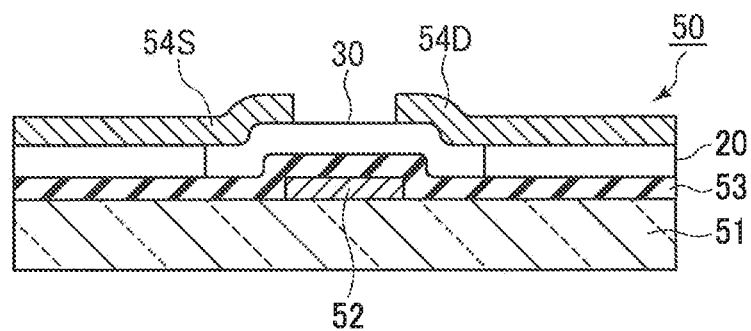
FIG. 12 is a schematic cross-sectional diagram of a first implementation in which a polycrystalline film, which results from the method for forming a polycrystalline film according to the first embodiment of the present invention, is used in a bottom gate thin film transistor.

FIG. 12 depicts a bottom gate thin film transistor 50 using the polycrystalline silicon film 30 according to the first embodiment as a channel region.

In this thin film transistor 50, a gate electrode 52 is formed on a glass substrate 51 in a predetermined pattern, a gate insulating film 53 is formed on the gate electrode 52, and a polycrystalline silicon film 30 is formed on the gate insulating film 53 as an active semiconductor layer forming a channel region. A source electrode 54S and a drain electrode 54D are formed on the polycrystalline silicon film 30.

The thin film transistor 50 reduces variation in contact resistance because of the smooth planar surface of the polycrystalline silicon film 30. Moreover, the thin film transistor 50 has no or little drop in breakdown voltage because surface protrusions near the last place in the crystal to solidify are avoided due to a reduction in stress concentration even on the lower side of the polycrystalline silicon film 30.

The thin aluminum or copper film with a bamboo structure which is created during execution of the step of forming a polycrystalline metal film according to the embodiment of the present invention may be used for wiring among a gate electrode 52, a source electrode 54S, and a drain electrode 54D in such thin film transistor 50. In this case, the thin film transistor 50 achieves a high breakdown voltage because the thin aluminum or copper film has no or little surface protrusions on its lower side overlying that area of a gate insulating film 53 which overlies the gate electrode 52.

Figure 13:
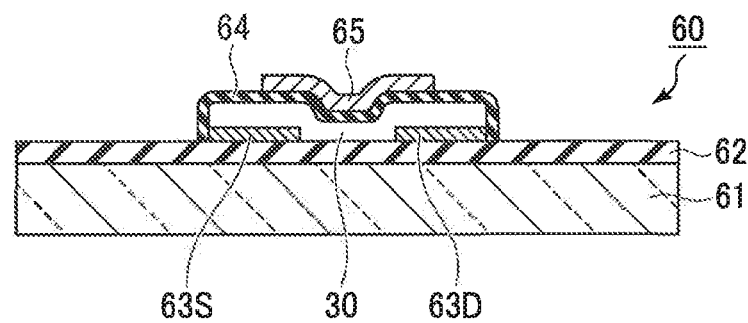
FIG. 13 is a schematic cross-sectional diagram of a second implementation in which a polycrystalline film, which results from the method for forming a polycrystalline film according to the first embodiment of the present invention, is used in a top gate thin film transistor.

FIG. 13 depicts a top gate thin film transistor 60 having a channel region made of the polycrystalline silicon film 30 according to the first embodiment.

In this thin film transistor 60, an insulating film 62 is formed on a glass substrate 61, and a source electrode 63S and a drain electrode 63D are formed on the insulating film 62. A polycrystalline silicon film 30 is formed on the source electrode 63S and the drain electrode 63D. A gate insulating film 64 is formed on the polycrystalline silicon film 30, and a gate electrode 65 is formed on the gate insulating film 64 in a predetermined pattern.

This thin film transistor 60 achieves a high breakdown voltage because the surface of the polycrystalline silicon film 30 has no or little protrusions.

The thin aluminum or copper film with a bamboo structure which is created during execution of the step of forming a polycrystalline metal film according to the embodiment of the present invention may be used for wiring among a gate electrode 65, a source electrode 63S, and a drain electrode 63D in the thin film transistor 60. In this case, the thin film transistor 60 achieves a high breakdown voltage because the thin aluminum or copper film has no or little surface protrusions on its lower side overlying that area of a gate insulating film 64 which overlies the gate electrode 65.

[Other Embodiments]

Although the embodiments of the present invention have been described above, it should be understood that the description and drawings illustrating the embodiments are exemplary only, and should not be taken as limiting the scope of the present invention. It will be apparent to those of ordinary skill in the art that the following description reveals various alternative embodiments, examples, and operational techniques.

Figure 15:
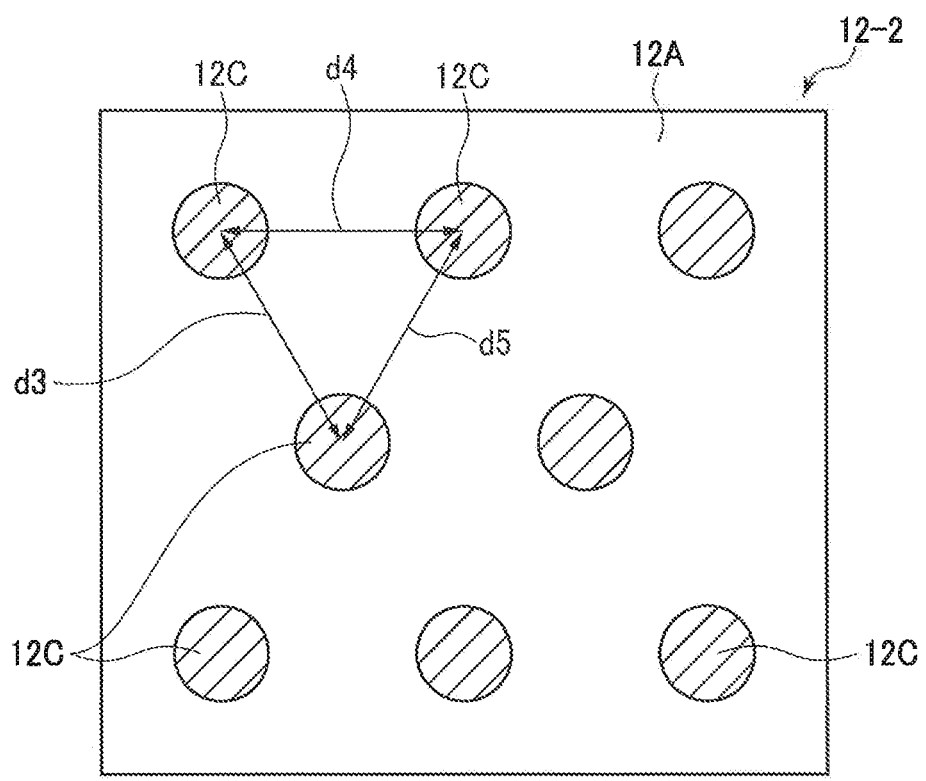
FIG. 15 is a schematic plan view of a portion of an alternative mask which may be used in the laser crystallization device according to the first embodiment of the present invention.

Although the first and second embodiments use the mask 12-1 depicted in FIG. 6 which has dots, i.e., opaque regions 12B, arranged in a matrix, the mask may be modified by shifting alternate rows by half a pitch. In the modified mask denoted at 12-2 in FIG. 15, the distances d3, d4, and d5 among neighboring three dots, i.e., opaque regions 12C, are equal (d3=d4=d5), where d4 is the distance between neighboring two dots in the same column, d3 is the distance between one of the two neighboring dots and that dot in the next alternate column which is shifted half a pitch from the one dot toward the other dot of the two neighboring dots, and d5 is the distance between the other dot of the two neighboring dots and that dot in the next alternate column. The distances d3, d4, and d5 are determined, so that no-lateral-growth regions are left near the last place in the crystal to solidify on the polycrystalline film which is being irradiated with modulated laser beam using this mask 12-2.

In the first and second embodiments, the mask 12-1 in which the opaque region 12B is arranged on the glass substrate 12A is used, but phase-shift masks may be used.

In the forgoing description about the embodiments, silicon (Si) is used as the semiconductor material to make up the crystal grains and the no-lateral-growth regions, but other semiconductor materials may be used. Although, in the foregoing description, examples in which aluminum and copper are used as the metal to make up the crystal grains and the no-lateral-growth regions are presented, but it is of course possible to apply other metals that crystallize in a film.

FIG. 16 depicts a laser crystallization device according to other embodiment of the present invention. The laser crystallization device according to this embodiment includes a mask 12-3 trimmed to the same size as a thin amorphous silicon film 20 to be irradiated. The mask 12-3 is integrated with the thin amorphous silicon film 20, so that the mask 12-3 faces the thin amorphous silicon film 20 and it does not move relative to the thin amorphous silicon film 20 in any directions within a plane parallel to the thin amorphous silicon film 20. The thin amorphous silicon film 20 is formed on a substrate (not shown).

As depicted in FIG. 16, in the laser crystallization device according to this embodiment, with the laser beam L shaped to a rectangular cross-sectional profile being held stationary for irradiation, the mask 12-3 and the thin amorphous silicon film 20 are uninterruptedly moved in a direction indicated by arrows S1 at a constant speed. The dots, i.e., opaque regions 12B, of the mask 12-3 are fixed relative to the surface of the thin amorphous silicon film 20 as the mask 12-3 is integrated to the thin amorphous silicon film 20. Thus, the microcrystal regions 31A and the crystal growth portions 31B appear at appropriate positions as the mask 12-3 and the thin amorphous silicon film 20 are moved to travel under the laser beam L.

FIG. 17 depicts a comparative example of a laser crystallization device with respect to the above-mentioned laser crystallization device. In this comparative example, with an irradiation source that emits a laser beam L and that has an integral mask 12 trimmed to the matching size to the cross-sectional profile of the laser beam L being held stationary for irradiation, a thin amorphous silicon film 20 is moved relative to the irradiation source with the integral mask 12. In this comparative example, with a desired area of the thin amorphous silicon film 20 being positioned under the mask 12, the thin amorphous silicon film 20 is spot-irradiated with the laser beam L. Next, the thin amorphous silicon film 20 is moved by a predetermined stroke indicated by a vector S2 to position the next desired area under the mask 12 to prepare for next scheduled spot-irradiation with the laser beam L. This cycle is repeated until all of the desired areas of the thin amorphous silicon film 20 are spot-irradiated with the laser beam L for lateral crystal growth to make a polycrystalline silicon film 30. This comparative example has a problem that a seam is likely to occur where the contour of the mask 12 is projected on the surface of the polycrystalline silicon film 30.

Compared to the comparative example, the laser crystallization device according to the embodiment depicted in FIG. 16 provides a polycrystalline silicon film 30 free from the occurrence of a seam derived from the contour of the mask 12-3. Moreover, the laser crystallization device depicted in FIG. 16 reduces the occurrence of a seam extending in a direction perpendicular to the direction (see arrow S1) of movement of the thin amorphous silicon film 20 because the thin amorphous silicon film 20 is irradiated with the laser beam L as it is uninterruptedly being moved.

REFERENCE SIGNS

L laser beam
G radial direction
1 mask
1A glass substrate
1B opaque region
2 amorphous film
3 unirradiated or masked region
3A microcrystal region (seed crystal formation region)
3B peripheral region
10 laser crystallization device
11 laser source
12-1, 12-2, 12-3 mask
12A glass substrate
12B opaque region
14 lens
20 thin amorphous silicon film
30 polycrystalline silicon (poly-Si) film
31 crystal grains
31A microcrystal region
31B crystal growth region
32 grain interface
33 no-lateral-growth region
40A aluminum film (microcrystalline structure)
40B aluminum film (lateral crystal growth)
40C aluminum film (polycrystalline film)
41 microcrystal
41A microcrystalline region
41B lateral crystal growth region
50 thin film transistor (bottom gate)
60 thin film transistor (top gate)

What is claimed is:

1. A polycrystalline film, comprising:
   evenly distributed crystal grains lining up in parallel lines extending along the surface of the film, and
   a no-lateral-growth region left at each of locations exposed to both ends of a grain interface, which serves as a partition between the neighboring two crystal grains, in a pattern that exposes the laterally crystallized film after lateral crystal growth, where: one of the both ends of the grain interface is separated from the other in a direction along the surface of the film,
   wherein each of the crystal grains is in the shape of a column having a height from the lower surface to the upper surface of the film, and
   the crystal grain includes a crystal core in the middle inside its limits within the surface of the film, the crystal core being in the shape of a column having a height from the lower surface to the upper surface of the film.

2. The polycrystalline film as claimed in claim 1, wherein the film surface portions of the crystal grains are flush with the film surface portions of the no-lateral-growth regions to make a flat and even surface.

3. The polycrystalline film as claimed in claim 1, wherein the distance, within the surface of the film, from the crystal core of each of the neighboring two crystal grains to the no-lateral-growth region is not shorter than the maximal lateral crystal growth length of the crystal grains.

4. The polycrystalline film as claimed in claim 1, wherein the crystal grains and the no-lateral-growth regions are made of a material selected from semiconductor materials and metals.

5. A method for forming a polycrystalline film by directing laser through a mask to irradiate an amorphous film to leave a large number of evenly distributed crystal grains lining up in parallel lines extending along the surface of the film, the method comprising:
providing a mask configured to modulate that portion of the laser which is directed therethrough to evenly distributed seed crystal generating regions set beforehand on an amorphous film to have an attenuated intensity;
allowing the amorphous film to crystalize using the seed crystal generating regions as seed crystals, and
leaving a no-lateral-growth region left at each of locations exposed to both ends of a grain interface, which serves as a partition between the neighboring two crystal grains, in a pattern that exposes the laterally crystallized film after lateral crystal growth, where: one of the both ends of the grain interface is separated from the other in a direction along the surface of the film.

6. The method as claimed in claim 5, wherein
the distance between the seed crystal generating region for one of the neighboring two crystal grains with the grain interface therebetween and that for the other is shorter than two times the maximal crystal growth length of the crystal grains, and
the distance between the seed crystal generating regions for the neighboring two crystal grains with the no-lateral-growth region therebetween is longer than two times the maximal crystal growth length of the crystal grains.

7. The method as claimed in claim 5, wherein
the amorphous film is made of a material selected from semiconductor materials and metals.

8. A laser crystallization device, comprising:
a laser source for generating laser; and
a mask configured to modulate the laser directed therethrough to the surface of an amorphous film,
wherein
the mask is configured to modulate that portion of the laser which is directed therethrough to evenly distributed seed crystal generating regions set beforehand on an amorphous film to have an attenuated intensity;
the laser with which a portion of the amorphous film adjacent to at least one of the seed crystal generation regions is irradiated has an intensity that is sufficient to melt through the entire thickness of the irradiated portion;
the irradiated portion of the amorphous film laterally crystalizes using the seed crystal generating regions as seed crystals upon cooling, and
the mask is configured to leave a no-lateral-growth region left at each of locations exposed to both ends of a grain interface, which serves as a partition between the neighboring two crystal grains, in a pattern that exposes the laterally crystallized film after lateral crystal growth, where: one of the both ends of the grain interface is separated from the other in a direction along the surface of the film.

9. The laser crystallization device as claimed in claim 8, wherein
the mask includes an opaque array pattern which allows that the distance between the seed crystal generating region for one of the neighboring two crystal grains with the grain interface therebetween and that for the other is shorter than two times the maximal crystal growth length of the crystal grains, and
that the distance between the seed crystal generating regions for the neighboring two crystal grains with the no-lateral-growth region therebetween is longer than two times the maximal crystal growth length of the crystal grain.

10. The laser crystallization device as claimed in claim 8, wherein
the amorphous film is made of a material selected from semiconductor materials and metals.

11. A semiconductor device comprising:
a polycrystalline film including evenly distributed crystal grains lining up in parallel lines extending along the surface of the film, and a no-lateral-growth region left at each of locations exposed to both ends of a grain interface, which serves as a partition between the neighboring two crystal grains, I n a pattern that exposes the laterally crystallized film after lateral crystal growth, where: one of the both ends of the grain interface is separated from the other in a direction along the surface of the film,
wherein each of the crystal grains is in the shape of a column having a height from the lower surface to the upper surface of the film, and
the crystal grain includes a crystal core in the middle inside its limits within the surface of the film, the crystal core being in the shape of a column having a height from the lower surface to the upper surface of the film.

12. The semiconductor device as claimed in claim 11, wherein the film surface portions of the crystal grains are flush with the film surface portions of the no-lateral-growth regions to make a flat and even surface.

13. The semiconductor device as claimed in claim 11, wherein
the distance, within the surface of the film, from the seed crystal forming region for each of the neighboring two crystal grains to one of the no-lateral-growth regions is not shorter than the maximal lateral crystal growth length of the crystal grains.

14. The semiconductor device as claimed in claim 11, wherein
the crystal grains and the no-lateral-growth regions are made of a material selected from semiconductor materials and metals.

15. The semiconductor device as claimed in claim 11, wherein
the polycrystalline film is a polycrystalline silicon film, and
the polycrystalline silicon film is an active semiconductor layer forming a channel region of a thin film transistor.

16. The semiconductor device as claimed in claim 15, wherein
the thin film transistor is a bottom gate thin film transistor.

17. The semiconductor device as claimed in claim 15, wherein
the thin film transistor is a top gate thin film transistor.

18. The semiconductor device as claimed in claim 11, wherein the polycrystalline film is made of aluminum (Al) and the crystal grains line up in a bamboo structure after patterning.

19. The semiconductor device as claimed in claim 11, wherein the polycrystalline film is made of copper (Cu).

* * * * *